Nov. 19, 1963 H. O. WOLCOTT 3,111,630

WIDE RANGE HIGH FIDELITY BALANCED AMPLIFIER

Filed Oct. 24, 1960 3 Sheets-Sheet 1

INVENTOR.
HENRY O. WOLCOTT

BY Harry R. Lubcke

AGENT

INVENTOR.
HENRY O. WOLCOTT
BY Harry R. Lubcke
AGENT

WIDE RANGE HIGH FIDELITY BALANCED AMPLIFIER

Filed Oct. 24, 1960 3 Sheets-Sheet 3

INVENTOR.
HENRY O. WOLCOTT

BY *Harry R. Lubcke*
AGENT

United States Patent Office 3,111,630
Patented Nov. 19, 1963

3,111,630
WIDE RANGE HIGH FIDELITY BALANCED AMPLIFIER

Henry O. Wolcott, Chatsworth, Calif., assignor to Optimation, Inc., Inglewood, Calif., a corporation of California Filed Oct. 24, 1960, Ser. No. 64,353
17 Claims. (Cl. 330—82)

My invention relates to electrical amplifiers and particularly to amplifiers of audio frequencies in which high fidelity and wide frequency band are obtained by employing balanced feedback.

While the prior art has employed negative feedback in audio frequency amplifiers, such feedback has usually encompassed the whole amplifier; from the input to the secondary of the output transformer. With theoretically perfect components, particularly an output transformer devoid of phase shift, this arrangement gives theoretically perfect results. However, in practice, the phase shift through the transformer at high frequencies precludes the effective use of such feedback. Often, it is necessary to reduce the open loop gain and therefore the feedback at high frequencies to a point where reasonable stability can be obtained. When this point is reached, usually very little feedback remains in the circuit and the distortion-reducing benefits thereof tend to be lost.

The art has known of local positive feedback and its advantages of zero output impedance and the fact that distortion in the output stage does not enter the signal output of the system. However, such feedback has seldom been used in practice because there is a tendency to oscillation at either or both of the extremes of the frequency spectrum and to introduce power supply hum and other residuals into the signal output.

I have been able to produce an amplifier of greatly improved performance by departing from the practices of the prior art in significant new ways.

Rather than obtaining negative feedback over the whole amplifier circuit I connect the feedback circuit to the primary of the output transformer. In this way I avoid the difficulties previously mentioned and also those caused by variation of impedance and phase of the loudspeaker or similar load as a function of frequency. It is not difficult to supply a relatively low distortion output transformer, since with the substantially zero output impedance of my positive feedback arrangement the magnetizing current distortion of the transformer cannot enter the output signal. No matter what might be the magnitude of this current, the zero impedance does not allow a voltage to be built up.

I have been able to eliminate the hum and residual difficulties of positive feedback and to accomplish desirable refinements in negative feedback by providing balanced feedback circuits and a summing circuit on each side of the amplifier in which the positive and the negative feedbacks are suitably combined. This results in a new amplifier structure, having substantially all of the advantages of such combined feedbacks and none of the disadvantages, as will be detailed below.

In an alternate embodiment I employ a tertiary winding upon the output transformer for the feedback connection, which winding is closely coupled to the primary and loosely coupled to the secondary of the transformer.

In a further alternate embodiment I provide a power transistor output stage. This is adapted to drive a low impedance load directly, without the use of an output transformer.

An object of my invention is to provide a high fidelity amplifier of excellent performance characteristics and of extreme stability of operation.

Another object is to provide a novel compound balanced feedback circuit.

Another object is to employ local positive feedback in a balanced manner that prevents the introduction of power supply hum and other residuals into the signal channel.

Another object is to provide a precision amplifier suited to driving galvanometer recorders, shake tables, ultrasonic devices, servo systems, or to constitute a variable frequency power source of low impedance having a range from the subaudible through ultrasonic frequencies.

Another object is to provide an amplifier adapted for plural kinds of input connections.

Another object is to provide an amplifier capable of driving loads having power factors from zero to one, leading or lagging.

Another object is to provide an amplifier of extremely low distortion, particularly the the extremes of the frequency range of operation.

Another object is to provide an amplifier having an output circuit that may or may not be grounded.

Other objects will become apparent upon reading the following detailed specification and upon examining the accompanying drawings, in which are set forth by way of illustration and example certain embodiments of my invention.

Figure 2:
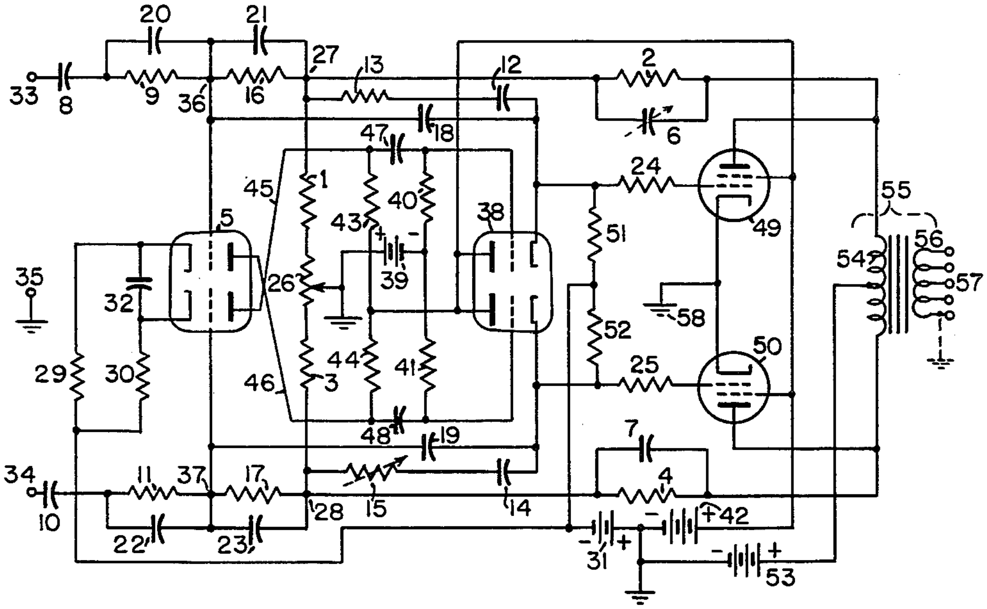
FIG. 2 is a complete schematic diagram of a typical embodiment of my invention.
Figure 7:
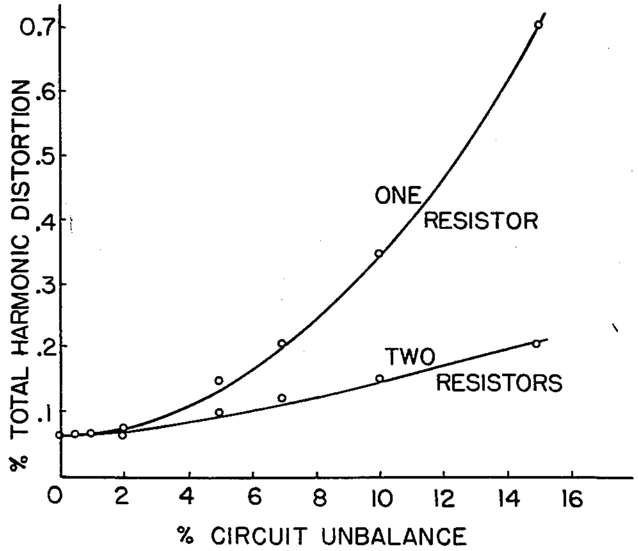
Figure 4:
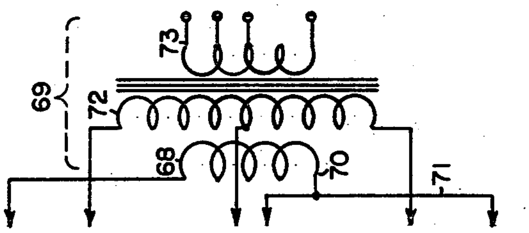
Figure 3:
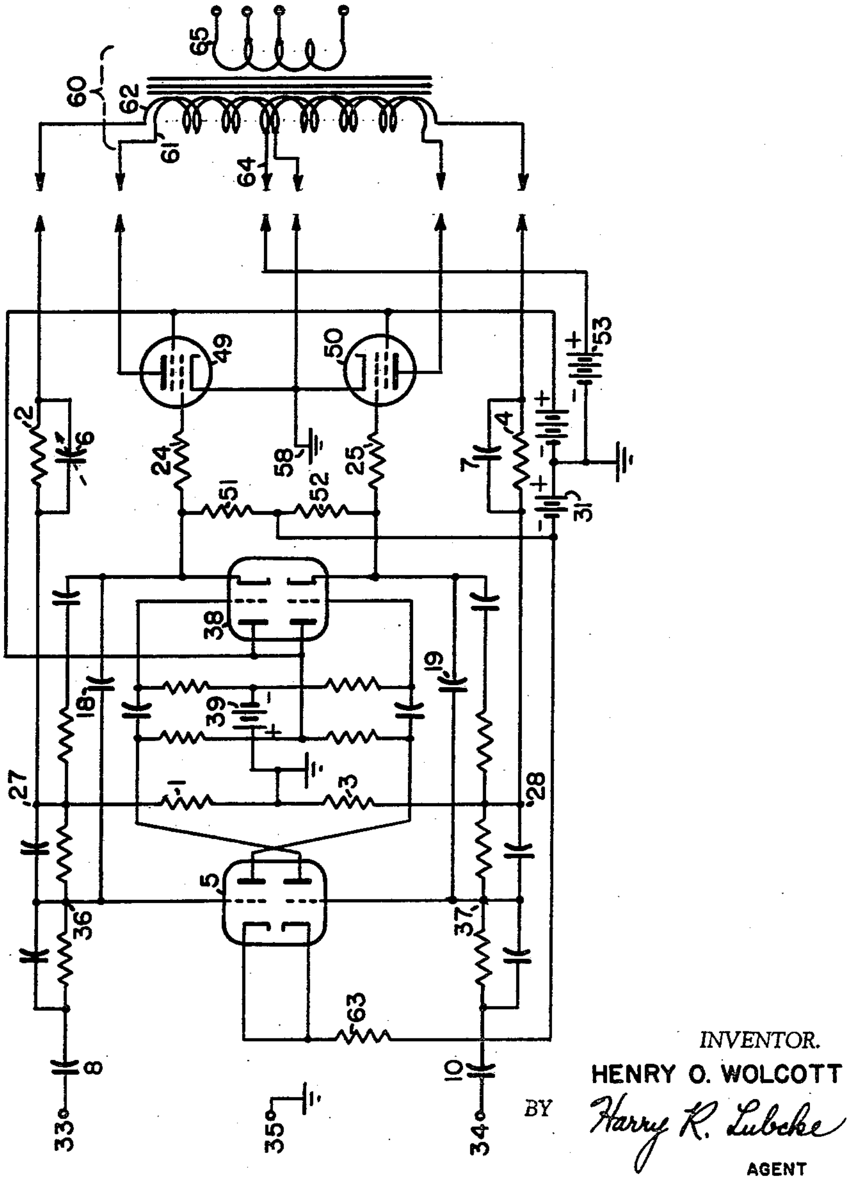
Figure 6:
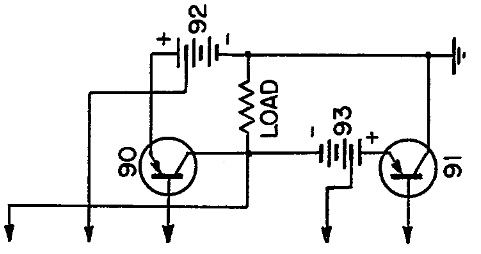
Figure 5:
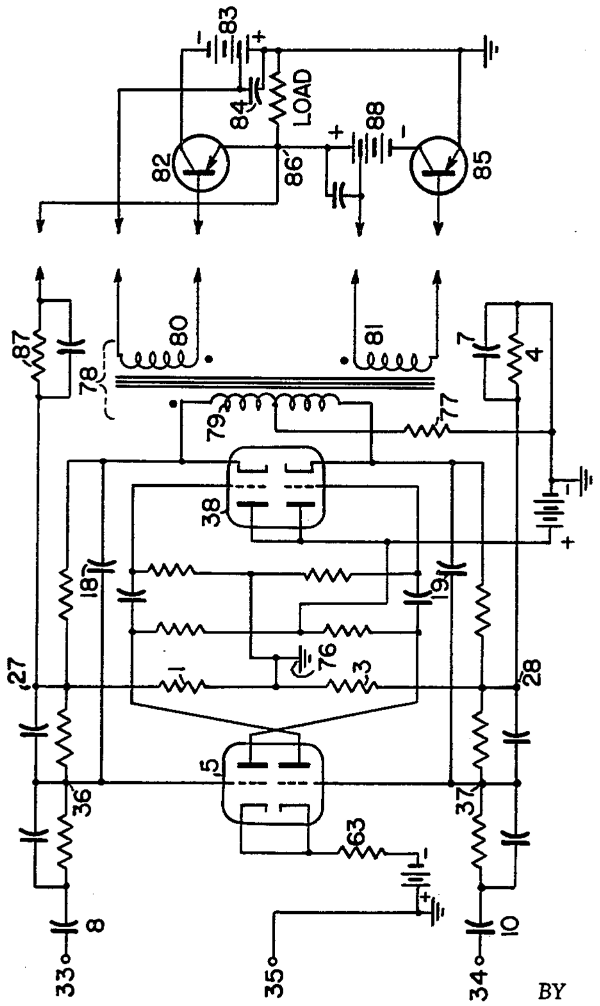

FIG. 3 is a schematic diagram of an alternate embodiment, showing a bifilar tertiary winding on the output transformer for feedback purposes, FIG. 4 is a fragmentary schematic diagram of the same, showing a grounded tertiary winding on the output transformer for feedback purposes, FIG. 5 is a schematic diagram of another alternate embodiment, in which power transistors are employed in an emitter-follower configuration, FIG. 6 is a fragmentary schematic diagram of the same, showing power transistors employed in a common-emitter configuration, and FIG. 7 is a graph showing the reduction of harmonic distortion as a function of circuit unbalance for my embodiment of FIG. 2.

Referring to FIG. 2, local positive feedback is applied around the first two stages of my amplifier and overall negative feedback is provided by two networks connected between each end of the primary of the output transformer and the corresponding out-of-phase grid of the input stage.

The operation of this configuration will be explained by reference to the simplified block diagram of FIG. 1.

Figure 1:
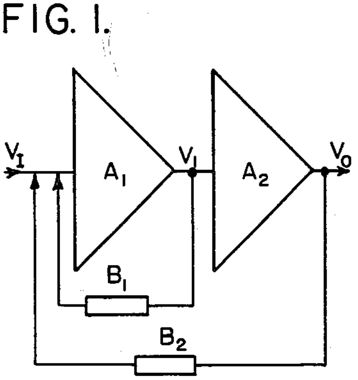
FIG. 1 is a simplified diagram having to do with positive feedback.

In FIG. 1, $A_1$ and $A_2$ represent two amplifiers in cascade; i.e. a pre-amplifying stage and an output stage. The amplification of each is likewise identified as $A_1$ and $A_2$, respectively. A portion, $B_1V_1$, of the output signal $V_1$ of amplifier $A_1$ is fed back to the input of $A_1$, and a portion $B_2V_o$ of the output signal $V_o$ of amplifier $A_2$ is likewise fed back to the input of amplifier $A_1$. If $V_I$ is the signal to be amplified, we may write, quite generally:

$$V_1=A_1(V_I+B_1V_1+B_2V_o) \quad (1)$$

and $$V_o=A_2V_1 \quad (2)$$

Forming the ratio $V_o/V_I$ by rearranging Equation 1 to be explicit in $V_I$ (rather than in $V_1$), multiplying both numerators and denominators by $A_1/V_1$ and substituting $A_2V_1$ for $V_o$ (from Equation 2) in the denominator of the ratio, the expression for the amplification is obtained.

Accordingly, the overall amplification, A, is:

$$A=\frac{V_o}{V_I}=\frac{A_1A_2}{1-A_1B_1-A_1A_2B_2}=\frac{A_1A_2}{N} \quad (3)$$

where $$N = 1 - A_1B_1 - A_1A_2B_2 \quad (4)$$

The total distortion, D, is given by:

$$D = \frac{1}{N}D_1 + \frac{1-A_1B_1}{N}D_2 + \frac{1-A_1B_1}{N}D_1D_2 \quad (5)$$

where $D_1$ and $D_2$ are, respectively, the distortions of the individual amplifiers involved.

When $A_1B_1$ is made unity a very special situation arises. The total amplification is equal to $1/B_2$ and is, therefore, independent of $A_2$. The output impedance is zero. The distortion of amplifier $A_2$ does not contribute at all to the total distortion.

The total distortion is thus entirely due to the first amplifier $A_1$ and is numerically equal to its distortion in the absence of feedback times the quantity $1/A_1A_2B_2$. Since the value of this quantity can be considerably greater than one, the resulting distortion can be appreciably less than that of the first stage alone. This is a particularly advantageous situation in the case of power amplifiers, where the output stage $A_2$ contains the relatively high distortion-producing output tube and transformer elements. Since with local positive feedback the output stage distortion does not enter, the variation of characteristics or equality of a pair of output tubes is not of importance. Thus, a dynamic balance control or pairs of matched tubes are not required.

In spite of the benefits indicated by theory, local positive feedback has not enjoyed acceptance in commercial equipment. This has been because of the difficulty of maintaining stability in practical circuits. There has been a tendency toward oscillation at either or both of the high and low frequency extremes of the passed band. Also, the amplifier has been sensitive to power supply ripple and to variations of supply voltages caused by line voltage transients or varying demand on the power supply.

I have eliminated these disadvantages by providing a fully balanced push-pull amplifier with balanced feedback circuitry. This configuration results in the noise and variations mentioned appearing as common mode variations, and these are greatly attenuated in an amplifier of this kind. The tendency toward oscillation or instability has been eliminated by placing the output transformer outside of the feedback loop and by optimizing the response of each of the two cascaded stages.

Amplifier stability is recognized by the attainment of critical damping. This I have achieved by limiting the feedback loop to two high and two low frequency time constants. (RC or LR minimum phase shift networks.) This limitation restricts an A.C. coupled amplifier to two stages (without phase compensation). At low frequencies each pair of coupling capacitors and each transformer count as one time constant.

A further requirement for critical damping is that the time constant be staggered; i.e., have different values. The staggering ratio required is determined by the amount of feedback used. For 20 db of feedback the ratio is greater than 40 to 1. In the low frequency range this usually means that the frequency where roll-off begins due to the coupling capacitors must be less than 1/40 the frequency where roll-off begins due to the output transformer. The frequency at which roll-off begins is not constant for the usual output transformer because of variation of the primary inductance. This is caused by variation of the permeability of the core, which is a complex function of the signal level and of the unbalance of plate currents in the output stage.

At high frequencies the usual output transformer presents further difficulties. It alone may account for two or three time constants, depending upon the conditions of use. When driven from a relatively high impedance source and terminated in a resistance it displays the characteristics of an LCR network; having two time constants and 180° maximum phase shift. When terminated in a capacitative load; such as a line matching transformer, electrostatic loudspeaker or a long transmission line, it displays the characteristics of a PI network; i.e. three time constants and 270° maximum phase shift.

It is seen that the large and variable amount of phase shift contributed by usual output transformers precludes effective feedback around them at high frequencies. Known expedients to alleviate this situation are to make the transformer bandwidth as wide as possible, use a maximum amount of phase compensation and to reduce the open loop gain. This reduces the feedback at high frequencies to a value where reasonable stability can be obtained. The reduction of feedback required is large and the distortion-reducing benefits thereof may be largely lost.

I have met the requirements for critical damping at low frequencies by providing D.C. (or direct) coupling between the driver and the output stage, by using phase compensation, and by employing a linear output transformer. The roll-offs are staggered in a representative embodiment by employing a time constant of 0.22 second, corresponding to an attenuation of 3 db and a phase shift of 45° at 0.75 cycle/second. The transmission of the transformer is the same for a frequency between 7 and 20 cycles/sec. The minimum frequency ratio thus obtained, in conjunction with the phase compensation provided in the feedback loop, provides a critically damped response.

The requirements for critical damping at high frequencies have been met by making the high frequency time constant of the driver stage so short as to be of no consequence. Also, by the use of feedback loop compensation instead of staggered roll-offs. The compensation is easily obtained by the addition of capacitors in shunt with the feedback resistors and has the advantage that it can be arranged to provide an optimum phase characteristic with an input stage of considerably smaller bandwidth than would be required with the staggering method. The reduced bandwidth requirement, consequently, permits an increase of gain and a reduction of distortion. Finally, high frequency critical damping has been secured by placing the output transformer outside of the feedback loop. The important advantage here is that the effect of this transformer on stability remains the same at low frequencies, but is reduced to that of one time constant at high frequencies, regardless of loading. Maximum phase shift at high frequencies is thus limited to 90° and will ordinarily be lagging (capacitative). As a result, a large degree of feedback may be used without danger of instability under any loading conditions.

Placing the transformer outside of the loop should seemingly result in loss of the effect of feedback because of distortion generated by the transformer itself. While this is a commonly held belief, it will be demonstrated that lower values of distortion can be obtained with the transformer out of the loop than can be obtained with it in the loop.

The transformer is a passive network and can introduce distortion only at low frequencies where the non-linearity of the core enters. This low frequency distortion can be reduced to the vanishing point by driving the transformer from a zero impedance source.

The distortion arises because of the non-linear relation between flux and magnetizing force in the core material. This causes the magnetizing current to be non-linear for a linear flux change and consequently a distorted voltage output. The extent of the distortion produced depends upon the magnitude of the non-linear component and upon the impedance of the driving source. This is because the harmonic voltages making up the distortion are developed across the source impedance by the flow of harmonic current through the source. If the source impedance is zero, as I provide, the magnetizing current cannot produce a voltage drop and hence cannot produce distortion.

The no distortion condition cannot quite be realized in practice, even with a zero impedance amplifier, because of the effect of the resistance in the primary of the transformer. This resistance forms a part of the source impedance and so prevents realization of the absolute zero value. As a further practical limitation, the low distortion characteristic can be maintained only up to that power level where the peak magnetizing current is still within the power capability of the amplifier. Fortunately, because of the quadrature relation to an in-phase load current, the maximum magnetizing current occurs when the load current is zero. Accordingly, the maximum magnetizing current can be almost as large as the maximum rated load current.

An output transformer alone cannot generate distortion at high frequencies, but an equivalent effect can be produced when the transformer is driven from a push-pull amplifier. This is when the transformer has unbalanced characteristics. This is particularly true when the amplifier is of the classes AB1, AB2 or B, in which the output plate current is cut off for part of the cycle. Under these conditions each tube fully amplifies only alternate half cycles of the signal. The current output of each tube is thus a distorted replica of the input. Recreation of an undistorted signal thus depends upon accurate summing of the two signal components in the output transformer. The presence of leakage inductance between windings impairs the summing capability at high frequencies to an extent determined by the magnitude of the unbalance component between the half primaries and the secondary.

Capacitative or resistive unbalance that may be present in the windings of the output transformer will also adversely affect the summing accuracy. The effects of capacitative unbalance are felt only at high frequencies and are greatest when the source impedance is high. The effects of resistive unbalance are relatively independent of frequency and reach a maximum when the source impedance is low.

When the output transformer is included within the feedback loop, the feedback tends to reduce the summing errors. This is not true when the transformer is employed in outboard fashion, as I do. The advantage of the former arrangement is not as great as might be expected, however, because the effectiveness of the feedback in reducing distortion becomes progressively less with increasing frequency due to phase shift and the necessity of reducing feedback at high frequencies to maintain stability. With the full feedback connection correction is required of the cumulative effect of both leakage inductance and capacitative unbalances, whereas in the outboard connection with zero impedance drive only the leakage unbalance has any effect. The capacitance effect is small because of the low circuit impedance.

Considering all factors, the balance of the output transformer must be excellent for either mode of operation if highest quality performance is to be obtained. My outboard mode has the advantage when an accurately balanced transformer is employed of lower distortion because considerably more feedback can be applied to the amplifier.

In my amplifier, where feedback is taken from the primary of the transformer, certain circuit conditions must be met; namely:

Negative feedback is taken from both output plates to obtain stability and low distortion at high audio and supersonic frequencies. This is because the two half-primaries become progressively decoupled at high frequencies because of leakage inducance. Large D.C. and relatively large A.C. ripple voltages are present at the output plates in a form having no direct relationship to the signal output at the transformer secondary. These voltages must be effectively eliminated from the feedback signal or severe distortion and hum may result.

Accurate balance of the circuit must be maintained, otherwise minimum distortion and noise output will not be realized.

I meet the first condition by the obvious symmetrical feedback connection of FIG. 2, and by employing sectionalization of the output transformer windings so that both low capacitance and low leakage inductance values are obtained. The differential input shown in FIG. 2 makes it possible to connect a negative feedback loop between each end of the primary of the output transformer and a corresponding input point of appropriate phase and gain.

In FIG. 2 the negative feedback loops consist of resistors 1 and 2 on the upper (first) side of the amplifier schematic and resistors 3 and 4 on the lower (second) side. These dual networks maintain balanced feedback over the full operating frequency range, provide cancellation of the D.C. and A.C. ripple voltages fed back from the plates of the output vacuum tubes to the grids of vacuum tube 5, and tend to maintain the gain of each side of the push-pull system at the same value regardless of vacuum tube variations. These networks largely meet the second and third circuit conditions set forth above.

High frequency phase compensation for these networks are provided by capacitors 6 and 7, which are in shunt with resistors 2 and 4, respectively. Typical capacitor values are 10 micro-microfarads, and capacitor 6 is made variable to compensate for minor variations of distributed and circuit capacitances.

Low frequency phase compensation is provided by the dual networks having capacitor 8 and resistor 9, and capacitor 10 and resistor 11. These elements are symmetrically disposed and symmetrically valued; typical values being of the order of 0.05 microfarad for each of the capacitors and one megohm for each of the resistors.

Resistors 1 and 3 are summing junctions for the overall negative feedback and for the local positive feedback signals. The latter are provided by the networks consisting of capacitor 12 and resistor 13 on one side of the amplifier, and capacitor 14 and resistor 15 on the other. Typical values for these elements are; a half microfarad for each capacitor and of the order of 120,000 ohms for each resistor.

These values of circuit components cause the positive feedback to fall off at low frequencies in approximately the same manner that the negative feedback falls off. The interstage coupling network 47, 40 and 48, 41, is present in both positive and negative feedback paths. The negative feedback rolls off at low frequencies because the primary inductance of the output transformer is finite. Capacitors 12 and 14 accomplish the roll off of the positive feedback. The time constants thereof, with resistors 13 and 15, respectively, are less than the corresponding time constants of the interstage coupling network.

A second set of summing junctions is provided by the networks consisting of resistors 9 and 16 on one side of the amplifier and resistors 11 and 17 on the other. Typical values for these elements are one megohm each. These sum the composite negative and positive feedback voltages, the input signals, and the Miller effect capacitance neutralization voltages. The latter are provided by capacitors 18 and 19, each having typical values of the order of 4 micro-microfarads. The second set of summing junctions are capacitance compensated by capacitors 20, 21, 22, 23, each having typical values of the order of 100 micro-microfarads. Resistor 15 is made variable in order to adjust the magnitude of positive feedback to the optimum value where $A_1B_1=1$. This can easily be done by temporarily biasing the output tubes to a near cut-off value and adjusting the positive feedback to the point just below oscillation, as indicated by sound from the loudspeaker.

Series grid resistors 24 and 25 provide parasitics suppression and improve the overload recovery response.

These each have a resistance value of the order of five thousand ohms.

Turning now to the remainder of the amplifier shown in FIG. 2, potentiometer 26 provides means for hum and circuit balance. The adjustable arm thereof is connected to ground and the extremities thereof to first and second low impedance junction points 27 and 28, respectively, through resistors 1, 3. It will be understood that resistors 1, 3 may be connected directly to ground, as has been inferred in the previous discussion. However, with potentiometer 26 present a desirably fine balance can be obtained. Typically, resistors 1 and 3 each have resistance values of approximately four thousand ohms and resistor 26 a value of one hundred ohms.

The values of resistors 1, 3 are related to the values of resistors 13, 15, respectively, in that the ratio (as resistor 1 to resistor 13) determines the magnitude of the positive feedback. For optimum positive feedback $A_1B_1=1$, the following expression must be satisfied:

$$\frac{R_9}{R_9+R_{16}}\times\frac{R_1}{R_1+R_{13}}\times\text{gain of vac. tube } 5=1 \qquad (6)$$

in which the $R_9$, etc., indicates the resistance value of resistor 9 of FIG. 2, and so on.

With typical values and a 12AX7 vacuum tube, the value of the first fraction is ½, of the second 1/31, and the gain of tube 5 is 62, giving a product of unity.

Overall circuit balance is obtained by adjusting the arm of potentiometer 26 in FIG. 2, while examining the hum output on an oscilloscope or while listening for minimum hum in a loudspeaker when the same in the useful load. The potentiometer provides the desired balance without affecting the magnitude of the positive or of the negative feedback. The value of summing resistor 1 is decreased by exactly the same amount as the value of resistor 3 is increased and vice versa.

A self-balancing aspect is provided by separate cathode resistors 29 and 30 in FIG. 2. These have typical values of the order of 400,000 ohms each when the voltage of battery 31 is —150 volts.

Resistors 29 and 30 actually set the current passed by each half of dual triode 5. The D.C. potential of each grid of vacuum tube 5 is positive with respect to ground by virtue of the voltage divider from the full power amplifier plate voltage formed by resistors 2 and 1 and one-half of resistor 26; to consider the upper half of the amplifier as drawn in FIG. 2. Accordingly, current flows in each triode of tube 5 until the potential of each cathode is, say, 1½ volts more positive than the voltage on that grid. The usual desired negative grid bias with respect to the potential of the cathode is thus established.

A difference in the D.C. potentials between grids due to inequality of the values of resistors 2 and 4, or 1 and 3, will not affect the operating grid bias because the resulting potential differences are small with respect to the 150 volt value of negative supply voltage 31. The plate current of the triode is not appreciably affected.

The plate current $I_p$ is determined by the relation:

$$I_p=\frac{E_c+E_g}{R_k} \qquad (7)$$

where:

$E_c$=voltage of supply 31 (as —150 v.)
$E_g$=voltage on grid of tube 5 (as plus 10 v.)
$R_k$=resistance of resistor 29 (as 400,000 ohms)

It is seen that if $E_g$ is small with respect to $E_c$ the value of $I_p$ will not be appreciably affected by a change in value of $E_g$.

Batteries have been shown throughout FIG. 2 for sake of circuit completeness, but it will be understood that known positive and negative A.C. to D.C. power supplies may be employed instead.

The above circuit aspects further meet the second and third circuit conditions that were previously set forth.

Capacitor 32 in FIG. 2 is provided to maintain both cathodes of tube 5 at the same alternating current potential by presenting a very low impedance between these elements. This occurs although the direct current potential of each cathode may be different because of the self-balancing mechanism just explained. A capacitance of the order of 25 microfarads is suitable for capacitor 32. If this is of the electrolytic variety it should be of the non-polarized type, since the polarity between the cathodes of tube 5 may be in either direction.

FIG. 7 shows the results of harmonic distortion as a function of circuit unbalance. This is for the embodiment of FIG. 2 for a signal frequency of 1,000 cycles. The lower curve, labelled "two resistors," gives data for the circuit with resistors 29 and 30. The same data for only one resistor in place of the two, 29 and 30, is shown in the upper curve labelled "one resistor." It is seen that the harmonic distortion is less than half as great for nominal values of unbalance and less than one-third as great for an unbalance of 15%. The small values of distortion, in the small fractions of one percent, are also to be noted. These measurements included residual noise also.

The input signal may be accepted by the amplifier of FIG. 2 in several different ways.

It may be impressed across terminals 33 and 34 differentially. A high degree of common mode signal rejection is obtained with this connection, such as 50 db in a practical embodiment.

A single-ended input signal is accepted by impressing the same between one of the previously mentioned terminals; say, between terminal 33 and ground terminal 35, while maintaining a ground connection or a very low impedance connection at terminal 34.

Finally, two separate signals may be introduced by connecting one between terminal 33 and ground terminal 35 and the other between terminal 34 and ground terminal 35. The two signals are combined in algebraic addition because of the balanced phase inverter operation of tube 5. Equal and oppositely-phased outputs are developed at the plates when either input is driven. This is because of the large value of cathode impedance; 200,000 ohms for the typical element values previously given.

In each of the modes of introducing the signal the impedance of the input source is desirably one-tenth the value of resistor 9; i.e., 1/10 megohm, or less. This prevents a change in the magnitude of the positive feedback by maintaining a relatively fixed impedance input termination and so keeps the attenuation of the network composed of resistors 9 and 16 and capacitors 20 and 21 constant.

Junction points 36 and 37 are termed high impedance junction points. These connect directly to each grid of dual vacuum tube 5. This vacuum tube preferably is one with a high amplification factor, such as a factor of 100 of type 12AX7.

The driver tube 38 of FIG. 2 is preferably a double triode, but one capable of greater current output than tube 5. This is so that a lower driving impedance to the output stage can be realized. Cathode follower connection is employed and this provides 100% negative voltage feedback. Thus tube 38 need not have as linear characteristic as tube 5. A high amplification factor and a short grid base is desirable. This allows the grid bias to be set at a low value of the order of 1.5 volts and so to minimize the effect of variation from tube to tube, when tubes are replaced, upon the grid bias of the output stage. This grid bias is determined by the cathode voltage of tube 38 because of the direct coupling between stages.

The cathode voltage of tube 38 is established by battery 39, which impresses the bias voltage via symmetrically connected grid leaks 40 and 41. Each of these have a resistance value of the order of two megohms to the grids in view of the cathode-follower connection. Plate voltage for this tube comes directly from battery 42, which has a voltage within the range of from 100 to 300 volts. This voltage is also connected to the plates of tube 5 through plate resistors 43 and 44, each of which have a resistance of the order of a quarter megohm.

It will be noted that the connections 45, 46, from the plate resistors to the plates of tube 5 are crossed over in the drawing of FIG. 2. This is so that the polarity of positive feedback is correct as shown. Symmetrically disposed and equal-valued coupling capacitors 47, 48 connect the plates of tube 5 to the grids of tube 38. A capacitance of one-tenth microfarad is typical.

The cathodes of cathode-follower tube 38 are directly connected to the grids of power tubes 49 and 50. Resistors 51 and 52 provide cathode return for tube 38 and connect from the cathodes thereof to the negative terminal of battery 31. This connection may also be termed the negative of the high voltage power supply, wherein the negative terminal thereof is not grounded but a point 150 volts positive therefrom is grounded. Resistors 51 and 52 typically have individual values of 40,000 ohms. Resistors 24 and 25, connecting between resistors 51, 52 and the control grids of tubes 49 and 50, are the series suppressor grid resistors previously mentioned. The cathodes of power tubes 49 and 50 are grounded. A higher voltage "B" battery 53 feeds the plates of the power tubes through a center tap on primary 54 of out-output transformer 55. The latter is typically the known step-down transformer, having a secondary 56, which may have several taps to match the impedance of various voice coils of loudspeakers, or to suit the impedance of galvanometer recorder elements, ultrasonic devices, etc. The secondary may or may not be grounded and is subject to considerable freedom of design, since negative feedback is not taken therefrom. Battery 53 represents the highest voltage output of a power supply and one that need not be filtered as thoroughly as the output from battery 42, when that battery is actually replaced by a power supply.

Power tubes 49 and 50 may be any tetrode or pentode pairs suited to the output power level desired, of which the 6L6, 6973 and EL84 are examples in the moderate power ratings.

Passing now to the mode of operation of the amplifier of FIG. 2 and to certain aspects of testing such amplifiers, a problem of the prior art has been that of static and dynamic unbalances caused by differences between the output tubes in push-pull systems. The main concern has been with the transconductance, $G_m$, and the static plate current characteristic, $I_p/E_g$; both of which may differ significantly from tube to tube in new tubes due to manufacturing tolerances and to even a greater extent with old tubes because of aging.

An unbalance in $G_m$ between tubes of the output stage produces even-harmonic distortion and a reduction of maximum power output (before clipping) by unbalancing the A.C. push-pull output currents which drive the output transformer.

An unbalance in $I_p/E_g$ characteristic causes an unbalance in the plate currents. This causes D.C. magnetization of the core of the output transformer, reducing the permeability thereof in a non-linear manner. This reduces self-inductance and introduces even-harmonic distortion.

Recognizing this problem, amplifier manufacturers of the prior art have incorporated controls and even meters in their amplifiers, so that the user might not only be enabled to make necessary adjustments, but might also be able to know when these were needed. Certain vacuum tube manufacturers have marketed matched pairs of power tubes in an effort to alleviate this problem.

Negative feedback reduces the deleterious effects of these unbalances but this can only reduce, not eliminate, the distortions produced. Furthermore, negative feedback is least effective at the frequencies where the distortion is greatest.

At low frequencies, for instance, feedback cannot correct for D.C. magnetization of the transformer core, although the distortion contributed can be reduced. It should be noted in passing that the D.C. balance requirement is most critical in amplifiers of the class A type because the quiescent plate current is highest. At high frequencies, where the effects of dynamic unbalance are most serious, feedback is also rather ineffective in correcting distortion because of phase shift at the high frequencies, as has been mentioned.

I have solved this problem by new circuitry that is insensitive to such unbalances.

The use of local positive feedback, as previously described, substantially eliminates the effects of distortion in the output stage. Additionally, this allows a lower value of quiescent plate current than possible in the prior art and so reduces distortions due to this aspect.

The use of push-pull balanced negative feedback serves to maintain the gain of each side of the push-pull system at a given value irrespective of variation of the gain of the vacuum tubes. This is particularly effective at high frequencies. A dynamic balance control is therefore not required.

The use of direct-coupled cathode-follower drivers essentially eliminates grid bias shift and any resulting plate current unbalance of the power tubes due to gas or emission grid currents. Furthermore, peak power output is increased because the output tube grids can be driven positive on signal peaks. A much better overload characteristic is also obtained because of drastically reduced recovery time.

The recovery time for an amplifier of the prior art employing A.C. coupling between the driver and the output vacuum tubes may be as much as several thousand times longer than the actual duration of the overload signal. This, of course, greatly increases the audible distortion caused by the overload. The overload signal in this instance causes a flow of grid current in the output tubes. This charges the coupling capacitors through a relatively low circuit impedance because of the grid conduction. A rapid increase of grid bias results. This causes severe distortions or even cut-off of amplification until such time as the charge leaks off from the coupling capacitors. This must take place through the greater impedance of the grid leaks before normal conditions are restored.

I eliminate this defect by the direct-coupled system and series grid resistors 24, 25 (previously described), which provide an instantaneous recovery for overloads up to 100%. Because I do not employ coupling capacitors the grid current merely produces a voltage drop across these resistors. This results in a clean clipping of the overload signal peaks and no aftereffects.

Because the grid impedance of my direct-coupled driver to power amplifier arrangement is low, destruction of a power amplifier vacuum tube by thermal runaway is essentially impossible. Likewise, plate current unbalance under malfunction conditions less than destruction is prevented.

Music, and numerous signals of purely technical origin, are of highly transient nature. Current test methods employ square waves or tone burst signals. I have indicated how that my amplifier is critically damped. Another effect that occurs in practice and may be tested-for with transient types of test signals is due to the reactive effect of the loudspeaker upon the amplifier. This is caused by the fact that loudspeakers store energy and because of their construction must be considered as voltage generating sources. The voltage generated represents a power fed back into the amplifier. The amplifier must be capable of absorbing and dissipating this energy without becoming unstable. Furthermore, the amplifier should constitute a resistive load upon the loudspeaker of a value that will fully dissipate the stored energy within the period of a half cycle of the fundamental frequency.

These demands are met in my amplifier because the structure thereof allows critical damping, in a manner that has been discussed.

The frequency range over which the amplifier must present a resistive load to loudspeaker "kick-back" extends to substantially zero frequency. Subsonic vibration may result from the application of low frequency noise signals or may be generated by the loudspeaker itself because of non-linear amplitude response.

Low frequency noise originating in the program material may originate as non-musical sounds, imperfections in recording apparatus or from the reproducing motor. If 35 cycle and 40 cycle tones are fed to a loudspeaker, for example, and the loudspeaker has nonlinear response, sum and difference frequencies of 5 and 75 cycles will be developed, as well as harmonics of the 35 and 40 cycle tones. If the 5 cycle kickback energy is not properly absorbed, amplifier instability, low frequency oscillation or distortion of audible bass sounds as reproduced by the loudspeaker may occur..

Measurements upon embodiments of my amplifier reveal that it provides a resistive load for loudspeaker kick-back having a resistance value less than one-tenth of the rated output impedance, and this down to zero frequency. Tone burst tests indicate faithful response over the full frequency range of operation without generation of subsonic or supersonic spurious signals at any amplitude up to the rated power limit. Square wave response is devoid of ringing or overshoots.

We turn now to alternate embodiments of my invention, of which FIG. 3 is generally the same as FIG. 2 except for a bifilarly wound tertiary winding on the output transformer for feedback purposes.

Output transformer 60 has a primary winding 61 essentially the same as prior primary winding 54. However, a third or tertiary winding 62 is wound essentially turn for turn with primary 61. It will be understood that the oppositely fronting arrow points between the output transformer connections and the connections to the rest of the amplifier represent completed connections in FIG. 3. Accordingly, while the extremities of the primary 61 connect to the plates of power tubes 49 and 50, the extremities of tertiary winding 62 connect directly and exclusively to negative feedback resistors 2 and 4, respectively.

This has the effect of removing both direct current voltages from the feedback circuit and also any hum voltage from the power supply (represented by battery 53).

Because of the absence of D.C. potentials, an unbalance cannot be produced between the cathodes and grids of each side of vacuum tube 5. Thus, only a single cathode resistor 63 is employed and capacitor 32 of FIG. 2 is eliminated.

Any hum voltage from source 53 is fed into primary 61 at center tap 64 and flows in opposite directions through this winding toward each extremity. Care is taken in constructing the transformer to have the tertiary winding balanced with respect to the primary and to have the primary balanced with respect to its center tap, hence no hum voltage is introduced into tertiary winding 62. Consequently, the balancing potentiometer 26 of FIG. 2 is eliminated at the grounded junction of resistors 1 and 3.

The secondary 65 of transformer 60 is conventional.

Another embodiment is shown in FIG. 4, in which the tertiary winding 68 of transformer 69 has one end 70 grounded and is not bifilarly wound with primary 72. This allows fewer turns to be employed on the tertiary winding, less possibility of voltage breakdown between primary and tertiary and therefore a less expensive output transformer than that of FIG. 3. In FIG. 4 the arrow points that front those of the circuit (left-hand) side of FIG. 3 are connections thereto, rather than the arrow points associated with transformer 60. Accordingly, top end connection of tertiary winding 68 of FIG. 4 connects to negative feedback resistor 2. The ratio of the resistance value of resistor 2 to resistor 1 for a given percent of voltage feedback depends upon the ratio of primary to tertiary turns. In FIG. 4, connection 71 grounds resistor 4 in FIG. 3 at 58 in FIG. 3.

The negative feedback circuit is thus asymmetric in the embodiment of FIG. 4 and so exact equality of resistors 2 and 4, capacitors 6 and 7, etc., need not be maintained. Resistors 3 and 4 are now in parallel and so may be replaced by a single resistor of equivalent value. The positive feedback circuit remains balanced in all figures and so is not altered from the disclosure of FIG. 2.

Primary 72 of transformer 69 in FIG. 4 connects to each plate of power tubes 49 and 50, as before. It is important that primary 72 and tertiary 68 be balanced and also that the coupling therebetween be closer than the coupling between the tertiary and secondary 73 by an order of magnitude, or as near ten times as can be practically obtained. Secondary 73 is otherwise conventional.

When the ratio of primary to tertiary turns are changed from 1 to 1 with a corresponding change in the ratio of resistors 2 and 1, the magnitude of the resistance values must also be changed in order to maintain the impedance of the summing junction 27 constant. This prevents a change of positive feedback.

It will be realized that any of secondaries 57, 65 or 73 may be operated grounded or ungrounded in my system. In the prior art where the feedback is taken from the secondary, this winding would have to be grounded at some point in order to accommodate the feedback path.

FIG. 5 shows a schematic diagram of an alternate embodiment of my invention in which power transistors are employed in the last cascaded stage instead of power vacuum tubes. This alternate reduces power requirements, decreases size and eliminates the output transformer in favor of an interstage transformer.

Driver vacuum tube 38 does not now supply the bias for the final stage and so former battery 39 is eliminated. The grids of tube 38 are returned directly to ground 76. Self bias for the cathodes of this tube are supplied by new resistor 77.

Interstage transformer 78 is approximately a one-to-one impedance ratio device, having a center-tapped primary 79 and two balanced secondaries 80 and 81. The secondaries should be tightly coupled to each other and to the primary in order to minimize high frequency phase shift for stability of feedback. The dots at one end of each winding of transformer 78 indicate the same phase of alternating current signal energy.

The dotted end of secondary 80 connects to the base electrode of a known PNP power transistor 82, which may be of the germanium, silicon or equivalent type. The opposite extremity of winding 80 connects to the collector of transistor 82 through battery 83. The tapped connection on the battery provides forward bias on the base electrode. This is to increase the emitter current and thereby prevent cross-over distortion between the two power transistors in the push-pull relation. The equivalent of the tap on the battery may be obtained by a voltage divider across a conventional power supply. The resistors comprising the voltage divider may be temperature sensitive to compensate for changes in transistor characteristics with temperature. With a low impedance power supply one bypass capacitor from the tap to one terminal of the supply will accomplish the necessary bypass function. The same may be employed across the battery, as capacitor 84, shown.

As in FIG. 4, negative feedback resistor 4 is in parallel with summing resistor 3 and these resistors may be combined into a single equivalent valued resistor. Capacitor 7 is retained in parallel therewith.

In the same manner as has been explained, secondary 81 and transistor 85 are connected together.

An asymmetric negative feedback is taken from ungrounded load terminal 86; which terminal also connects directly to the emitter of transistor 82. This feedback passes to prior resistor 2; which, however, has a lower resistance value than in FIG. 2 and so has been designated resistor 87 in FIG. 5. The opposite load terminal is grounded, and the emitter of transistor 85 is also connected to ground. As has been previously mentioned, the load may conveniently be of low impedance, such as a voice coil or the armature of a shake table.

Should NPN transistors be employed in FIG. 5, it is only necessary to reverse the polarity of the batteries. For either type transistor, a voltage of the batteries 83 and 88 of from twelve to twenty-four volts would be representative.

FIG. 6 is similar to FIG. 5, except that the common emitter connection of PNP transistors is shown. This circuit differs from that of FIG. 5 in that the input impedance to the transistor stage is lower. Accordingly, a two or three to one step-down ratio of impedance is employed for transformer 78.

In FIG. 6, the emitter and collector electrodes of transistor 90 are interchanged with respect to those of transistor 82 of FIG. 5 and battery 92 is reversed in polarity with respect to battery 83. A similar situation obtains with respect to transistor 91 and battery 93. The load impedance is essentially the same as that of FIG. 5.

Should NPN transistors be employed in FIG. 6 it is only necessary to reverse the polarity of the batteries.

Various other modifications in the characteristics of the circuit elements, details of circuit connections and alteration of the coactive relation between the elements may be taken without departing from the scope of my invention.

Having thus fully described my invention and the manner in which it is to be practiced, I claim:

1. In an amplifier having input terminals and plural balanced stages,
with each of said stages having an input and an output and having first and second sides of symmetry of circuit and the output of the first of said plural balanced stages interchanged as to sides with respect to the input of the second of said plural balanced stages, a feedback network comprising,
a first junction point on the first said side of said circuit and a second junction point on the second said side of said circuit,
resistive means to provide negative feedback connected from the output of the last of said stages to at least one of said junction points,
balanced resistive-capacitative means to provide positive feedback connected from the first side of the output of the next to the last of said stages to said first junction point and the second side of the output of the next to the last of said stages to said second junction point,
resistive means to connect each of said junction points to a signal ground,
first impedance means to connect said first junction point to the first said side of the input of the first of said plural stages,
and second impedance means to connect said second junction point to the second said side of the input of the first of said plural stages,
third impedance means to connect the first said input terminal to the first said side of the input of the first of said plural stages,
and fourth impedance means to connect the second said input terminal to the second said side of the input of the first of said plural stages.

2. The feedback network of claim 1, in which, additionally,
first capacitance means to provide capacitance neutralization is connected from the first side of the output of the next to last of said plural stages to the first side of the input of the first of said plural stages,
and in which second capacitative means to provide capacitance neutralization is connected from the second side of the output of the next to last of said plural stages to the second side of the input of the first of said plural stages.

3. In an amplifier having balanced input terminals and plural balanced individual stages each with input and output circuits having symmetry as to first and second sides, and with the output circuit of the first of said plural stages interchanged as to sides with respect to the input circuit of the succeeding of said plural stages,
feedback means comprising
two resistors,
each of said resistors having one end connected to ground and an opposite end,
at least electrical impedance negative feedback elements connected from the first said side of the last of said plural stages to said opposite end of said resistor on said first side,
a positive feedback element connected from the first said side of an intermediate one of said individual stages to said opposite end of said resistor on said first side,
a positive feedback element connected from the second said side of an intermediate one of said individual stages to said opposite end of said resistor on said second side,
and two impedances connected in series having approximately equal impedance values and connected between one of said opposite ends of said resistors and one of said input terminals on each of said first and said second sides of said balanced amplifier,
the junction between each of said series-connected impedances connected to the input of the first of said individual stages on the same said side of said balanced amplifier.

4. In an amplifier having input terminals balanced with respect to signal ground and having plural balanced stages each with input and output circuits having symmetry of circuit characterized by first and second opposed sides and the output circuit of the first of said plural stages connected with an interchange of sides to the input circuit of the succeeding one of said plural stages,
feedback means comprising
a low impedance feedback junction on each side of said amplifier,
a resistor connecting each said low impedance to signal ground,
resistance-capacitance elements connected from the output circuit of the last of said plural balanced stages to at least one said low impedance junction to provide negative feedback,
further resistance-capacitance elements connected from said first side of the output circuit of the next to last of said plural balanced stages to said low impedance feedback junction of said first side to provide positive feedback,
and still further resistance-capacitance elements connected from said second side of the output circuit of the next to last of said plural balanced stages to said low impedance feedback junction of said second side to also provide positive feedback,
a high impedance junction on said first and said second sides of said amplifier connected to the first and second sides, respectively, of the input circuit of the first of said plural balanced stages,
resistance-capacitance elements connecting said low and said high impedance junctions on each side,
and equivalent resistance-capacitance elements connecting said high impedance junctions on each side to said balanced input terminals on each corresponding side.

5. In an amplifier having a balanced input and plural balanced individual stages including an input and an output stage, each of said plural stages having circuit symmetry with opposed sides throughout the circuit of each said stage, and wherein said sides are interchanged between the input stage and the succeeding stage, feedback means comprising two resistors, each said resistor having one end connected to ground, negative feedback impedance elements connected from each side of said output stage of said amplifier to each side of said input stage of said amplifier, and to one of said two resistors on the corresponding side at the end of said resistor opposite to the said end thereof that is connected to ground, and a balanced positive feedback impedance element connected from each side of the next to the last of said plural stages to each corresponding side of a prior said plural stage, and also to one of said two resistors on the same side at the end of said resistor opposite to the said end thereof connected to ground for summing each of said feedbacks in each of said two resistors.

6. In an amplifier characterized by side to side symmetry of arrangement of circuit elements and having a differential input stage followed by a push-pull cathode-follower driver stage direct coupled to a push-pull power output stage, symmetrically balanced feedback means comprising a high and a low impedance circuit junction for each side of said amplifier, a first resistor and capacitor combination connected in parallel between the output of each side of said push-pull output stage and said low impedance junction for the corresponding side of said amplifier to constitute a negative feedback path, a second resistor and capacitor combination connected in series between the output of each side of said push-pull driver stage and said low impedance junction for the corresponding side of said amplifier to constitute a positive feedback path, another resistor from each said low impedance junction to ground to act as a common summing element for the recited groups of circuits on each of said sides, a third resistor and capacitor combination connected in parallel between said low impedance and said high impedance junctions on each said side of said amplifier, a fourth resistor and capacitor combination connected in parallel between said high impedance junctions and the input terminals of said differential input stage for each said side of said amplifier, a vacuum tube having a grid and a plate for each side of said differential input stage, each said high impedance junction connected to the said grid of the corresponding side of said vacuum tube and each said plate reversed side for side in connection to said driver stage, and another capacitor from each side of the output of said push-pull driver stage to the said high impedance junction of each side of said amplifier for capacitance neutralization.

7. The amplifier of claim 6 in which each vacuum tube of said input stage has a separate cathode, further resistors of equal resistance value connected from each said cathode to input signal ground, and a capacitance of low capacitative reactance with respect to the resistance of one of said further resistors, said capacitance of low capacitative reactance connected between said cathodes;

said further resistors and said capacitance of low capacitative reactance coactive to eliminate the effects of resistive unbalance in said amplifier.

8. In an amplifier having plural balanced individual cascade-connected stages, each with first and second sides of symmetry of circuit and including a differential input first stage with the outputs thereof interchanged side for side, first and second junction points, each of said junction points having a resistive impedance connected thereto and to ground, said first junction point connected to said first side of the first of said balanced stages and said second junction point connected to said second side of the first of said balanced stages, positive feedback means connected between said first side of the next to the last of said balanced stages and the first said junction point and positive feedback means connected between said second side of the next to the last of said balanced stages and the second said junction point, and a transformer having a primary connected to the output of the last of said balanced stages and having a secondary;

negative feedback means comprising a tertiary winding upon said transformer having close and symmetrical coupling to said primary and loose coupling to said secondary, the end of said tertiary winding corresponding to the second said side of symmetry of circuit connected to ground, the other end of said tertiary winding connected to the said first junction point through a resistor having a resistance value proportional to the number of turns of said tertiary winding.

9. The negative feedback means of claim 8 in which a capacitor is connected in parallel with said resistor to provide a leading phase shift to the negative feedback energy.

10. In an amplifier having balanced input impedances, plural balanced individual cascade-connected stages characterized by symmetrical arrangement of circuit elements side to side in each of said stages corresponding to the opposed phases of the signal to be amplified, the first of said stages symmetrically connected to said input impedances, two input junction points, one said input junction point connected to one of the two sides of the first of said stages and the other said input junction point connected to the other of the two sides of the first of said stages, positive feedback means connected between one side of the next to the last of said balanced stages and the said junction point on that one side, and further positive feedback means connected between the other side of the next to the last of said balanced stages and the said junction point on the other side, and an output transformer having a primary, said primary connected to the output of the last of said balanced stages;

negative feedback means comprising, a tertiary winding bifilarly wound with said primary, the center of said tertiary winding connected to signal ground, and a resistor connected between each extremity of said tertiary winding and the said input junction point having the opposite phase of signal to that at said extremity.

11. The negative feedback means of claim 10 in which a capacitor of high capacitative reactance with respect to the resistance of each said resistor is connected in parallel with each said resistor.

12. In an amplifier having plural balanced cascade-connected stages, each with opposite sides to the symmetry of the balanced circuit thereof and including a symmetrical differential input stage to provide opposed phases of a signal, two input junction points, each having a resistive impedance connected thereto and to ground and each connected to one said side of said differential input stage, two feedback means, one thereof connected between each of the opposite sides of the next to the last of said balanced stages and that one of the two said junction points on the side of said amplifier having the same phase of signal to provide positive feedback, and a last stage of said amplifier having a transistor; further feedback means comprising a resistor connected between an electrode of said transistor and the one of said junction points having the opposed phase of said signal to provide negative feedback, and a capacitor connected in parallel with said resistor to form a parallel combination of elements having a leading phase angle.

13. An amplifier comprising a cathode-coupled phase-inverter input stage for providing opposite phases of an input signal, said input stage having input terminals, a push-pull driver stage connected to the output of said input stage, a transformer having a primary connected to the output of said driver stage and having two secondaries closely coupled to said primary, a pair of power transistors, an output terminal, an electrode of one of said power transistors connected to said output terminal, one of said two secondaries connected between the base electrode of said one power transistor and ground, the other of said two secondaries connected between the base electrode of the other said power transistor and said output terminal, two junction points symmetrically connected to said input stage, each having a resistive impedance connected thereto and to ground and each connected to one of said input terminals through an impedance, positive feedback means connected from both the push and the pull sides of the circuit of said driver stage and the corresponding one of said junction points having the same phase of signal, and negative feedback means connected from said output terminal to the one said junction point having the opposite phase of signal.

14. The amplifier of claim 13 in which the said electrode of one of said power transistors is the emitter electrode thereof.

15. The amplifier of claim 13 in which the said electrode of one of said power transistors is the collector electrode thereof.

16. In a symmetrical amplifier having a differential input stage with symmetry characterized by opposite sides, said input stage connected in reversed side for side symmetry to a push-pull cathode-follower driver stage also having symmetry characterized by opposite sides, said driver stage direct-coupled to a push-pull power output stage also having symmetry characterized by opposite sides, two junction points, said junction points symmetrically connected to said differential input stage side for side, balanced negative feedback means connected from each side of the output of said output stage to a said junction point on each side of said input stage, and balanced positive feedback means connected from each side of the output of said driver stage to a said junction point;

means to minimize residual hum and resistive unbalance in said amplifier comprising, a resistive potentiometer having a variable contact, said potentiometer connected across said junction points and said variable contact thereof connected to ground.

17. In the amplifier of claim 16, further means to minimize resistive unbalance in said amplifier comprising a vacuum tube having two cathodes connected within said differential input stage in a symmetrical manner, separate resistors connecting each cathode of said vacuum tube to a signal ground, and a capacitor having low capacitative reactance with respect to the resistance values of said separate resistors, said capacitor connected to each of said cathodes of said vacuum tube.

References Cited in the file of this patent

UNITED STATES PATENTS

| | | |
|---|---|---|
| 2,272,235 | Boucke | Feb. 10, 1942 |
| 2,763,732 | Rockwell | Sept. 18, 1956 |
| 2,777,905 | Kelly | Jan. 15, 1957 |
| 2,813,934 | Cibelius et al. | Nov. 19, 1957 |
| 2,909,623 | Blecher | Oct. 20, 1959 |
| 2,924,781 | Wilson et al. | Feb. 9, 1960 |